US012624420B2

(12) United States Patent
Larose

(10) Patent No.: US 12,624,420 B2
(45) Date of Patent: May 12, 2026

(54) OXIDATION AND SRZ RESISTANT COATINGS ON NICKEL SUPERALLOYS

(71) Applicant: Pratt & Whitney Canada Corp., Longueuil (CA)

(72) Inventor: Joël Larose, Longueuil (CA)

(73) Assignee: Pratt & Whitney Canada Corp., Longueuil (CA)

( * ) Notice: Subject to any disclaimer, the term of this patent is extended or adjusted under 35 U.S.C. 154(b) by 32 days.

(21) Appl. No.: 18/208,681

(22) Filed: Jun. 12, 2023

(65) Prior Publication Data

US 2023/0399722 A1 Dec. 14, 2023

Related U.S. Application Data

(60) Provisional application No. 63/351,419, filed on Jun. 12, 2022.

(51) Int. Cl.
*C22C 19/05* (2006.01)
*B22D 21/02* (2006.01)
(Continued)

(52) U.S. Cl.
CPC .......... *C22C 19/057* (2013.01); *B22D 21/025* (2013.01); *B32B 15/01* (2013.01);
(Continued)

(58) Field of Classification Search
CPC ... C22C 19/057; C22C 19/056; C22C 19/058; C22C 19/051; C22C 19/00; B22D 21/025; B32B 15/01; B32B 15/016; B32B 15/017; B32B 15/04; B32B 15/043; C22F 1/10; C23C 14/025; C23C 14/16; C23C 14/325;
(Continued)

(56) References Cited

U.S. PATENT DOCUMENTS

| | | | |
|---|---|---|---|
| 8,221,901 B2 | 7/2012 | Harada et al. | |
| 8,267,663 B2 | 9/2012 | Larose et al. | |

(Continued)

FOREIGN PATENT DOCUMENTS

| | | |
|---|---|---|
| EP | 2377683 A2 | 10/2011 |
| EP | 2474648 A2 | 7/2012 |
| EP | 2700733 A1 | 2/2014 |

OTHER PUBLICATIONS

European Search Report dated Jul. 18, 2023 for European Patent Application No. 23178695.5.
(Continued)

*Primary Examiner* — Michael E. La Villa
(74) *Attorney, Agent, or Firm* — Bachman & LaPointe, P.C.

(57) ABSTRACT

An article has a nickel-based alloy substrate having, in weight percent: 5.4-7.4 Re; 4.1-5.9 Ru; 3.0-6.2 Cr; 3.0-10.0 Co; 0.5-3.8 Mo; 3.0-6.0 W; 4.6-8.6 Ta; 5.0-6.4 Al; 0.050-0.30 Hf; no more than 0.50 all other elements, if any, individually; and no more than 2.0 all other elements, if any, combined. A nickel-based coating is on the substrate and comprising, in weight percent: 6.0-10.0 Al; 4.0-15.0 Cr; 11.0-15.0 Co; 0.1-1.0 Hf; 0.1-1.0 Si; 0.1-1.0 Y; up to 1.0 Zr if any; up to 7.0 Ta if any; up to 6.0 W if any; no more than 1.0 all other elements, if any, individually; and no more than 4.0 all other elements, if any, combined.

21 Claims, 6 Drawing Sheets

(51) Int. Cl.

| | |
|---|---|
| *B32B 15/01* | (2006.01) |
| *B32B 15/04* | (2006.01) |
| *C22C 19/00* | (2006.01) |
| *C22F 1/10* | (2006.01) |
| *C23C 14/02* | (2006.01) |
| *C23C 14/16* | (2006.01) |
| *C23C 14/32* | (2006.01) |
| *C23C 28/00* | (2006.01) |
| *C23C 28/02* | (2006.01) |
| *C23C 30/00* | (2006.01) |
| *F01D 5/28* | (2006.01) |

(52) U.S. Cl.
CPC .......... *B32B 15/016* (2013.01); *B32B 15/017* (2013.01); *B32B 15/04* (2013.01); *B32B 15/043* (2013.01); *C22C 19/00* (2013.01); *C22C 19/051* (2013.01); *C22C 19/056* (2013.01); *C22C 19/058* (2013.01); *C22F 1/10* (2013.01); *C23C 14/025* (2013.01); *C23C 14/16* (2013.01); *C23C 14/325* (2013.01); *C23C 28/021* (2013.01); *C23C 28/022* (2013.01); *C23C 28/023* (2013.01); *C23C 28/30* (2013.01); *C23C 28/32* (2013.01); *C23C 28/3215* (2013.01); *C23C 28/322* (2013.01); *C23C 28/34* (2013.01); *C23C 28/345* (2013.01); *C23C 28/3455* (2013.01); *C23C 30/00* (2013.01); *C23C 30/005* (2013.01); *F01D 5/28* (2013.01); *F01D 5/286* (2013.01); *F01D 5/288* (2013.01); *F05D 2230/31* (2013.01); *F05D 2260/95* (2013.01); *F05D 2300/171* (2013.01); *F05D 2300/1723* (2013.01); *F05D 2300/173* (2013.01); *F05D 2300/611* (2013.01); *Y10T 428/12458* (2015.01); *Y10T 428/12611* (2015.01); *Y10T 428/12618* (2015.01); *Y10T 428/12931* (2015.01); *Y10T 428/12944* (2015.01)

(58) Field of Classification Search
CPC ....... C23C 28/022; C23C 28/30; C23C 28/32; C23C 28/3215; C23C 28/34; C23C 28/3455; C23C 28/021; C23C 28/023; C23C 28/322; C23C 28/345; C23C 30/00; C23C 30/005; F01D 5/288; F01D 5/28; F01D 5/286; F05D 2230/31; F05D 2260/95; F05D 2300/171; F05D 2300/1723; F05D 2300/173; F05D 2300/611; Y10T 428/12931; Y10T 428/12944; Y10T 428/12458; Y10T 428/12611; Y10T 428/12618

See application file for complete search history.

(56) References Cited

U.S. PATENT DOCUMENTS

| | | | |
|---|---|---|---|
| 2006/0093851 A1 | 5/2006 | Darolia et al. | |
| 2009/0075115 A1 | 3/2009 | Tryon et al. | |
| 2009/0274928 A1 | 11/2009 | Harada et al. | |
| 2010/0009092 A1 | 1/2010 | Tryon et al. | |
| 2011/0142714 A1 | 6/2011 | Harada et al. | |
| 2011/0171057 A1 | 7/2011 | Kobayashi et al. | |
| 2013/0202913 A1 | 8/2013 | Kawagishi et al. | |
| 2019/0070830 A1* | 3/2019 | Larose .................. C23C 14/14 | |
| 2021/0001603 A1 | 1/2021 | Larose et al. | |

OTHER PUBLICATIONS

Kyoko Kawagishi et al., "Development of an Oxidation-Resistant High-Strength Sixth-Generation Single-Crystal Superalloy TMS-238", Superalloys 2012 International Symposium on Superalloys, TMS (The Minerals, Metals, & Materials Society), Sep. 10, 2012, pp. 189-195, John Wiley & Sons, Inc., Hoboken, New Jersey.

Kyoko Kawagishi et al., "Development of an Oxidation-Resistant High-Strength Sixth-Generation Single-Crystal Superalloy TMS-238", Superalloys 2012: 12th International Symposium on Superalloys, Apr. 2012, pp. 189-195, TMS (The Minerals, Metals & Materials Society), Pittsburgh, Pennsylvania.

Kazuhide Matsumoto et al., "Development of Thermal Barrier Coating System Using EQ Coating for Advanced Single Crystal Superalloys", Superalloys 2016: Proceedings of the 13th International Symposium on Superalloys, Jul. 2016, pp. 279-283, TMS (The Minerals, Metals & Materials Society), Pittsburgh, Pennsylvania.

Sunguk Wee et al., "Review on Mechanical Thermal Properties of Superalloys and Thermal Barrier Coating Used in Gas Turbines", Aug. 2020, Basel, Switzerland.

"Nickel Base Single Crystal Superalloy TMS-196", Jul. 2008, High Temperature Materials Center National Institute for Materials Science, Ibaraki, Japan.

"Fifth Generation Nickel Base Single Crystal Superalloy TMS-196", Jul. 2006, High Temperature Materials Center National Institute for Materials Science, Ibaraki, Japan.

US Office Action dated Feb. 27, 2024 for U.S. Appl. No. 17/978,470.

Sato, A., Harada, H. & Kawagishi, K., "Development of New Bond Coat 'EQ Coating' System", Metall Mater Trans, Mar. 2006, pp. 789-790, A 37, Springer Nature Limited, London, United Kingdom.

* cited by examiner

1

OXIDATION AND SRZ RESISTANT COATINGS ON NICKEL SUPERALLOYS

CROSS-REFERENCE TO RELATED APPLICATION

Benefit is claimed of U.S. Patent Application No. 63/351,419, filed Jun. 12, 2022, and entitled "Oxidation and SRZ Resistant Coatings on Nickel Superalloys", the disclosure of which is incorporated by reference herein in its entirety as if set forth at length.

BACKGROUND

The disclosure relates to high temperature nickel-based superalloys. More particularly, the disclosure relates to oxidation resistant superalloy coatings for such superalloys.

Gas turbine engines (used in propulsion and power applications and broadly inclusive of turbojets, turboprops, turbofans, turboshafts, industrial gas turbines, and the like) often include cast single-crystal nickel-based superalloys are used for turbine section blades. Such alloys are notoriously subject to oxidation and require oxidation-resistant coatings. Example coatings include diffusion aluminides and vapor deposited MCrAlY coatings. Such coatings may be used alone (commonly on components that are not internally cooled) or may be used as bondcoats for ceramic coatings (commonly on components that are internally cooled). However, many coatings exhibit excessive secondary reaction zone (SRZ) formation with the substrate material.

Prior blade substrate and coating combinations that have been proposed include those in US Pub. Nos. 2006/0093851 A1, 2009/0075115 A1, and 2009/0274928 A1. Metallic coatings may be the outermost layer (subject to oxidation layers, etc.) or may be bond coats for ceramic thermal barrier coatings (TBC) deposited thereatop.

US Pub. No. 2021/0001603 A1 (the '603 publication), of Larose et al., published Jan. 7, 2021 and entitled "Oxidation-Resistant Coated Superalloy" the disclosure of which is incorporated by reference herein in its entirety as if set forth at length, discloses a series of castable Ru-containing single-crystal (SX) nickel based (Ni largest element content by weight) superalloys designated CPW-V 1 through CPW-V 11 and MCrAlY overlay coatings designated CPW-C1 through CPW-C6. Various combinations presented particularly advantageous oxidation and SRZ resistance. The substrate alloys were purported to have advantageous creep properties relative to Ru-free PWA1484.

Additionally, the Japan National Institute for Materials Science (NIMS) has developed an Ru-containing alloy designated TMS-196 and a subsequent derivative designated as TMS-238. These are respectively designated as 5th and 6th generation alloys. TMS-196 and TMS-238 are disclosed in Kawagishi, Kyoko, An-Chou Yeh, Tadaharu Yokokawa, Toshiharu Kobayashi, Yutaka Koizumi and Hiroshi Harada, "Development of an Oxidation-Resistant High-Strength Sixth-Generation Single-Crystal Superalloy TMS-238", Superalloys 2012: 12th International Symposium on Superalloys, October, 2012, pp 189-195, The Minerals, Metals & Materials Society (TMS), McCandless, Pennsylvania (Kawagishi et al. 2012).

Also see US Pub. No. 2011/0142714 A1 (the '714 publication) (Ex. 1 re. TMS-238 and Ref. Ex. 9 re. TMS-196) and US Pub. No. 2011/171057 A1 (the '057 publication) (disclosing deeper background art).

A coating for TMS-196 is disclosed in U.S. Pat. No. 8,221,901B2 (the '901 patent). Coatings for TMS-238 are disclosed in Matsumoto, Kazuhide & Kawagishi, Kyoko & Harada, Hiroshi, "Development of Thermal Barrier Coating System Using EQ Coating for Advanced Single Crystal Superalloys: Proceedings of the 13th Interational Symposium of Superalloys", July, 2016, pp. 279-284, TMS (The Minerals, Metals & Materials Society), Warrendale, PA (Matsumoto et al. 2016).

Other coatings are seen in US Pub. No. 2013/202913 A1 (the '913 publication).

In the '901 patent, Table 6 Example 28 TMS-196 exhibits 25 micrometers SRZ thickness with Coating H. This is lower than the '901 patent reference examples, but still higher than the best performing '901 patent examples (1 micrometer or less) for other substrates.

SUMMARY

One aspect of the disclosure involves an article comprising a nickel-based alloy substrate comprising (or alternatively consisting of or consisting essentially of), in weight percent: 5.4-7.4 Re; 4.1-5.9 Ru; 3.0-6.2 Cr; 3.0-10.0 Co; 0.5-3.8 Mo; 3.0-6.0 W; 4.6-8.6 Ta; 5.0-6.4 Al; 0.050-0.30 Hf; no more than 1.0 (optionally more narrowly 0.50) all other elements, if any, individually; and no more than 4.0 (optionally more narrowly 2.0) all other elements, if any, combined. A nickel-based coating is on the substrate and comprising (or alternatively consisting of or consisting essentially of), in weight percent: 6.0-10.0 Al; 4.0-15.0 Cr; 11.0-15.0 Co; 0.1-1.0 Hf; 0.1-1.0 Si; 0.1-1.0 Y; up to 1.0 Zr if any; up to 7.0 Ta if any; up to 6.0 W if any; no more than 1.0 (optionally more narrowly 0.50) all other elements, if any, individually; and no more than 4.0 (optionally more narrowly 2.0) all other elements, if any, combined.

In a further embodiment of any of the foregoing embodiments, additionally and/or alternatively, a secondary reaction zone, if any of the substrate is no more than 5.0 micrometers thick.

In a further embodiment of any of the foregoing embodiments, additionally and/or alternatively, the substrate lacks a secondary reaction zone.

In a further embodiment of any of the foregoing embodiments, additionally and/or alternatively, the coating comprises an additive layer and a diffusion layer and the coating composition is measured in the additive layer (e.g., centrally within the additive layer).

In a further embodiment of any of the foregoing embodiments, additionally and/or alternatively, the substrate consists essentially of said weight percent: Ni; 5.4-7.4 Re; 4.1-5.9 Ru; 3.0-6.2 Cr; 3.0-10.0 Co; 0.5-3.8 Mo; 3.0-6.0 W; 4.6-8.6 Ta; 5.0-6.4 Al; and 0.050-0.30 Hf. The coating consists essentially of said: Ni; 6.0-10.0 Al; 4.0-15.0 Cr; 11.0-15.0 Co; 0.1-1.0 Hf; 0.1-1.0 Si; 0.1-1.0 Y; up to 1.0 Zr if any; up to 7.0 Ta if any; and up to 6.0 W if any.

In a further embodiment of any of the foregoing embodiments, additionally and/or alternatively, the substrate is a single crystal substrate.

In a further embodiment of any of the foregoing embodiments, additionally and/or alternatively, a ceramic coating is atop the coating.

In a further embodiment of any of the foregoing embodiments, additionally and/or alternatively, the coating comprises (or alternatively consists of or consists essentially of), in weight percent: 6.3-9.4 Al; 4.1-14.1 Cr; 11.4-14.2 Co; 0.1-0.5 Hf; 0.1-0.8 Si; 0.2-0.8 Y; up to 0.8 Zr if any; up to 6.2 Ta if any; up to 5.3 W if any; no more than 0.50 all other elements, if any, individually; and no more than 2.0 all other elements, if any, combined.

In a further embodiment of any of the foregoing embodiments, additionally and/or alternatively, the coating comprises (or alternatively consists of or consists essentially of), in weight percent: 6.0-8.0 Al; 4.0-6.0 Cr; 11.0-15.0 Co; 0.1-1.0 Hf; 0.1-1.0 Si; 0.1-1.0 Y; up to 1.0 Zr if any; 5.0-7.0 Ta; 4.0-6.0 W; no more than 0.50 all other elements, if any, individually; and no more than 2.0 all other elements, if any, combined.

In a further embodiment of any of the foregoing embodiments, additionally and/or alternatively, the coating comprises (or alternatively consists of or consists essentially of), in weight percent: 6.3-7.7 Al; 4.1-5.3 Cr; 11.8-14.2 Co; 0.1-0.5 Hf; 0.2-0.8 Si; 0.2-0.8 Y; up to 0.8 Zr if any; 5.0-6.2 Ta; 4.3-5.3 W; no more than 0.50 all other elements, if any, individually; and no more than 2.0 all other elements, if any, combined.

In a further embodiment of any of the foregoing embodiments, additionally and/or alternatively, the coating comprises (or alternatively consists of or consists essentially of), in weight percent: 7.0-10.0 Al; 10.0-15.0 Cr; 11.0-14.0 Co; 0.1-1.0 Hf; 0.1-1.0 Si; 0.1-1.0 Y; 0.1-1.0 Zr; no more than 0.50 all other elements, if any, individually; and no more than 2.0 all other elements, if any, combined.

In a further embodiment of any of the foregoing embodiments, additionally and/or alternatively, the coating comprises (or alternatively consists of or consists essentially of), in weight percent: 7.6-9.4 Al; 10.9-14.1 Cr; 11.4-13.6 Co; 0.1-0.5 Hf; 0.1-0.8 Si; 0.2-0.8 Y; 0.1-0.5 Zr; no more than 0.50 all other elements, if any, individually; and no more than 2.0 all other elements, if any, combined.

In a further embodiment of any of the foregoing embodiments, additionally and/or alternatively, the nickel-based alloy substrate comprises (or alternatively consists of or consists essentially of), in weight percent: 6.2-6.6 Re; 4.7-5.2 Ru; 4.1-5.1 Cr; 5.3-6.8 Co; 0.9-2.7 Mo; 3.8-5.2 W; 5.4-7.9 Ta; 5.5-6.1 Al; 0.050-0.15 Hf; no more than 0.50 all other elements, if any, individually; and no more than 2.0 all other elements, if any, combined.

In a further embodiment of any of the foregoing embodiments, additionally and/or alternatively, the nickel-based alloy substrate comprises (or alternatively consists of or consists essentially of), in weight percent: 5.4-7.4 Re; 4.1-5.9 Ru; 3.0-6.2 Cr; 3.0-8.2 Co; 1.0-3.8 Mo; 4.0-6.0 W; 4.6-6.6 Ta; 5.0-6.2 Al; 0.050-0.30 Hf; no more than 0.50 all other elements, if any, individually; and no more than 2.0 all other elements, if any, combined.

In a further embodiment of any of the foregoing embodiments, additionally and/or alternatively, the nickel-based alloy substrate comprises (or alternatively consists of or consists essentially of), in weight percent: 6.2-6.6 Re; 4.7-5.2 Ru; 4.1-5.1 Cr; 5.3-5.9 Co; 2.2-2.7 Mo; 4.8-5.2 W; 5.4-5.8 Ta; 5.5-5.8 Al; 0.050-0.15 Hf; no more than 0.50 all other elements, if any, individually; and no more than 2.0 all other elements, if any, combined.

In a further embodiment of any of the foregoing embodiments, additionally and/or alternatively, the nickel-based alloy substrate comprises (or alternatively consists of or consists essentially of), in weight percent: 5.4-7.4 Re; 4.1-5.9 Ru; 3.0-6.2 Cr; 3.0-10.0 Co; 0.5-1.7 Mo; 3.0-5.0 W; 6.6-8.6 Ta; 5.4-6.4 Al; 0.050-0.30 Hf; no more than 0.50 all other elements, if any, individually; and no more than 2.0 all other elements, if any, combined.

In a further embodiment of any of the foregoing embodiments, additionally and/or alternatively, the nickel-based alloy substrate comprises (or alternatively consists of or consists essentially of), in weight percent: 6.2-6.6 Re; 4.7-5.2 Ru; 4.1-5.1 Cr; 6.2-6.8 Co; 0.9-1.3 Mo; 3.8-4.2 W;

7.3-7.9 Ta; 5.7-6.1 Al; 0.050-0.15 Hf; no more than 0.50 all other elements, if any, individually; and no more than 2.0 all other elements, if any, combined.

In a further embodiment of any of the foregoing embodiments, additionally and/or alternatively, the composition of the substrate is measured away from a diffusion zone with the coating; and the composition of the coating is measured away from a diffusion zone with the substrate.

In a further embodiment of any of the foregoing embodiments, additionally and/or alternatively, in the coating in weight percent one or more of: (a) $10.0 \leq (Cr+W+Mo) \leq 16.0$; (b) $0.0 \leq (Ta+W+Mo) \leq 13.0$; (c) $10.0 \leq W+Ta \leq 12.0$ or $Ta+W \leq 0.05$; (d) $Mo \leq 2.0$; $Re \leq 0.05$; and (e) $Ru \leq 0.05$.

In a further embodiment of any of the foregoing embodiments, additionally and/or alternatively, a gas turbine engine includes the article along a gaspath.

In a further embodiment of any of the foregoing embodiments, additionally and/or alternatively, a method for manufacturing the article comprises: casting the substrate; and applying the coating (e.g., via cathodic arc deposition).

Other aspects involve methods of using the article of claim 1, the method comprising: exposing the article to an oxidative atmosphere and heat; the exposing growing an oxide layer having a thickness of 2.5 micrometers to 13 micrometers; and the exposing not forming an SRZ layer, if any, of thickness greater than 1.0 micrometer. Examples of the exposing include running in a gas turbine engine and laboratory or factory exposure in an oxidative atmosphere (e.g., air) at elevated temperature.

The details of one or more embodiments are set forth in the accompanying drawings and the description below. Other features, objects, and advantages will be apparent from the description and drawings, and from the claims.

BRIEF DESCRIPTION OF THE DRAWINGS

Like reference numbers and designations in the various drawings indicate like elements.

DETAILED DESCRIPTION

Figure 11:
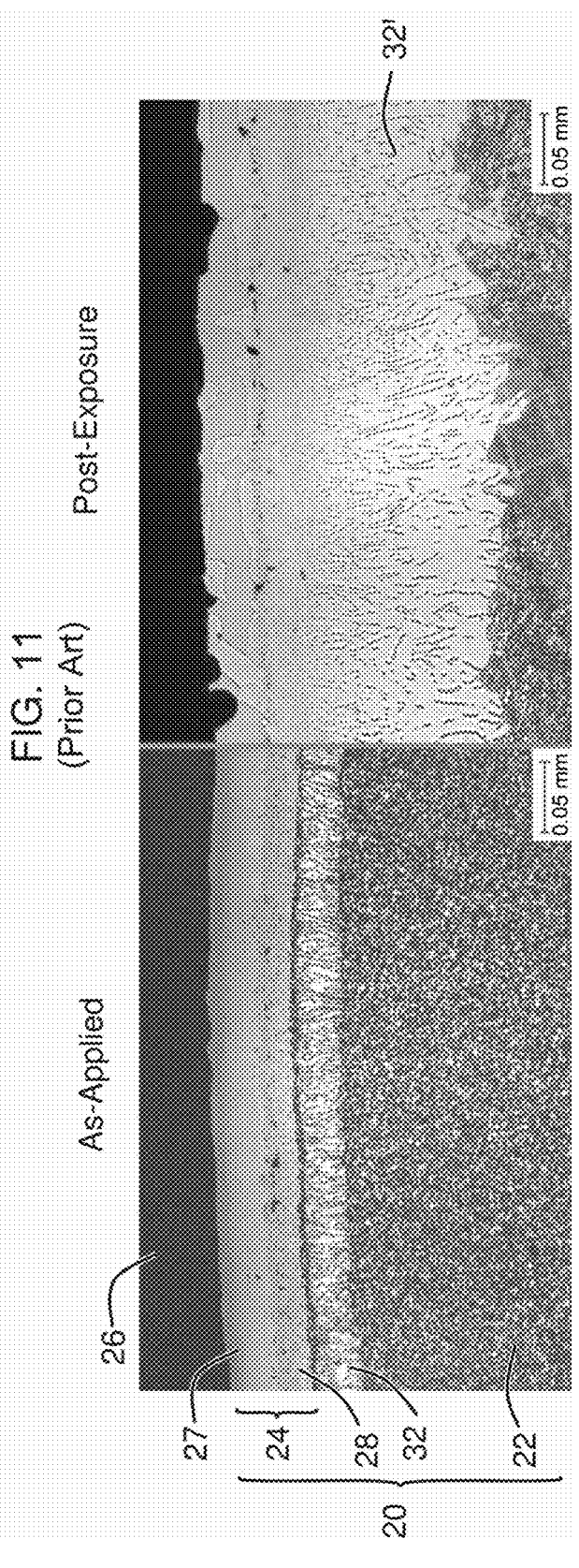
FIG. 11 is a pair of sectional photomicrographs of a prior art superalloy substrate/aluminide coating combination in an as applied condition (left) and a post-exposure condition (right).

FIG. 11 shows an article 20 comprising a Ni-based single crystal (SX) substrate 22 with a Ni-based coating 24 thereatop. In this example, the substrate is TMS-162 and the coating is MDC-150L (Alcoa Howmet Thermatech Coatings, Whitehall, Michigan, US). An epoxy mount for the sectioning is shown as 26. The coating 24 is applied directly to the exposed surface of substrate (e.g., via a physical vapor deposition (PVD) process such as cathodic arc deposition).

The coating 24 is further divided into regions including an additive zone 27 and a diffusion zone 28 below the additive zone (representing substrate material into which additive coating material has diffused). Example as-applied thickness is 0.002-0.004 inch (0.05-0.10 mm), more broadly, 0.001-0.006 inch (0.025-0.15 mm). An oxide layer at the coating surface may be just perceptible.

A highly columnar secondary reaction zone (SRZ) 32 has a thickness which may exceed 0.001 inch (0.025 mm). The SRZ is widely accepted as being a brittle P-phase that causes unacceptable reductions in mechanical properties such as fatigue and creep (See, e.g., W. S. WALSTON et al., "A New Type of Microstructural Instability in Superalloys-SRZ", Superalloys 1996, published Sep. 1, 1996, pages 9-18, The Minerals, Metals & Materials Society, Warrendale, Pennsylvania and O. LAVIGNE et al., "Relationships Between Microstructural Instabilities and Mechanical Behaviour in New Generation Nickel-Based Single Crystal Superalloys", Superalloys 2004, published Jan. 1, 2006, pages 667-675, The Minerals, Metals & Materials Society, Warrendale, Pennsylvania).

The example post-exposure micrographs in FIG. 11 and further figures below reflect heating in air at ambient pressure to a temperature of 2000° F. (1093° C.) for a period of 400 hours. The SRZ 32' has expanded to a thickness in excess of 0.005 inch (0.13 mm). The expanded SRZ 32' more greatly compromises strength properties.

Figure 1:
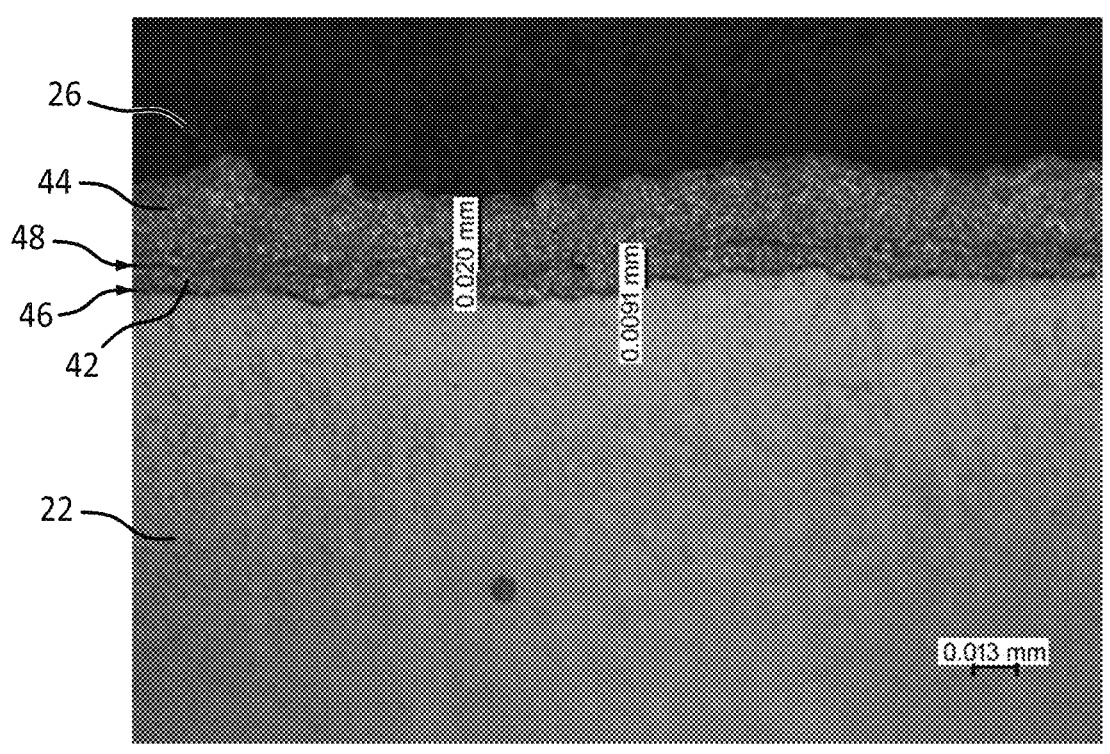
FIG. 1 is a sectional micrograph of a TMS-196 substrate/'603 publication C1 coating combination in an as applied condition.
Figure 2:
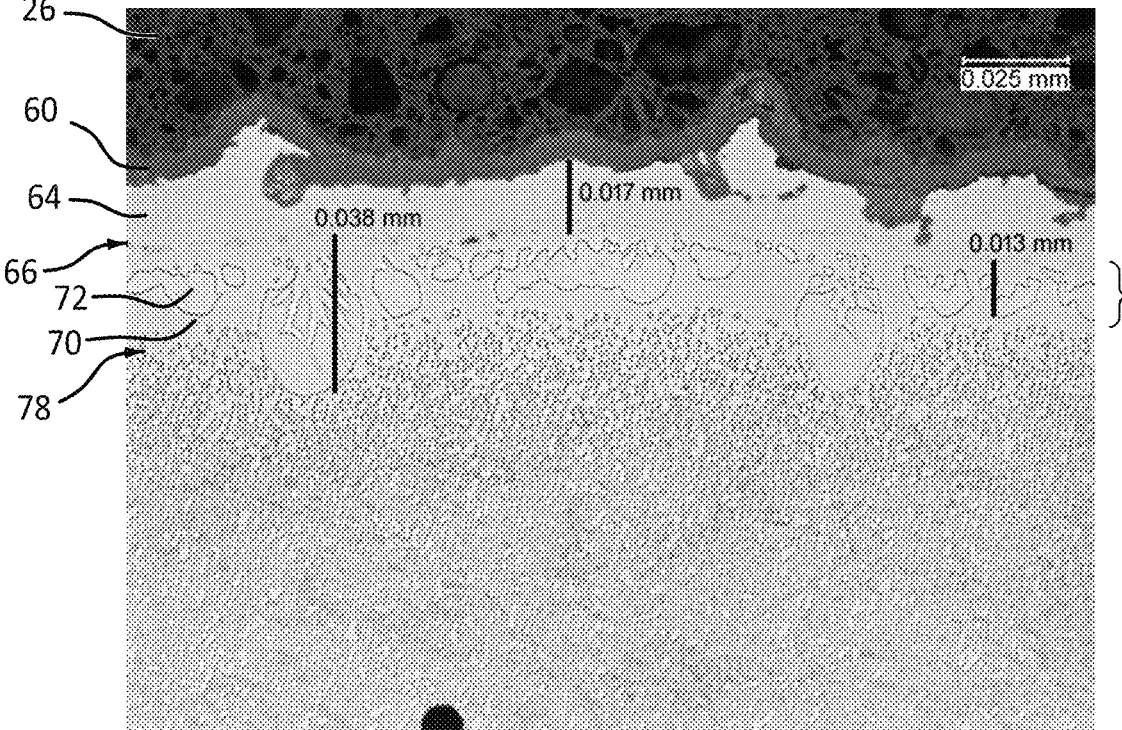
FIG. 2 is a sectional micrograph of the combination of FIG. 1 in a post-exposure condition.

In testing, a particular benefit was seen in the pairing of a TMS-196 or TMS-238 substrate and a CPW-C1 or CPW-05 coating of the '603 publication. FIGS. 1-8 show these pairings. In FIG. 1 (TMS-196/C1), the coating 50 has two apparent sublayers: a lower layer 42 and an upper layer 44. A sharp dark boundary 48 between the layers 42 and 44 is the original substrate surface prior to coating and a sharp dark boundary 46 is below the lower layer. The darkness may be an etchant artifact (e.g., as opposed to a void). Thus, the lower layer 42 represents a diffusion zone caused by the diffusion heat treatment the coating undergoes after deposition while the upper layer 44 represents the additive zone or layer on top of the original surface and that has not diffused into the substrate. Example as-applied additive layer 44 thickness is 0.001-0.004 inch (0.025-0.10 millimeter), more broadly, 0.008-0.006 inch (0.020-0.15 millimeter).

Figure 9:
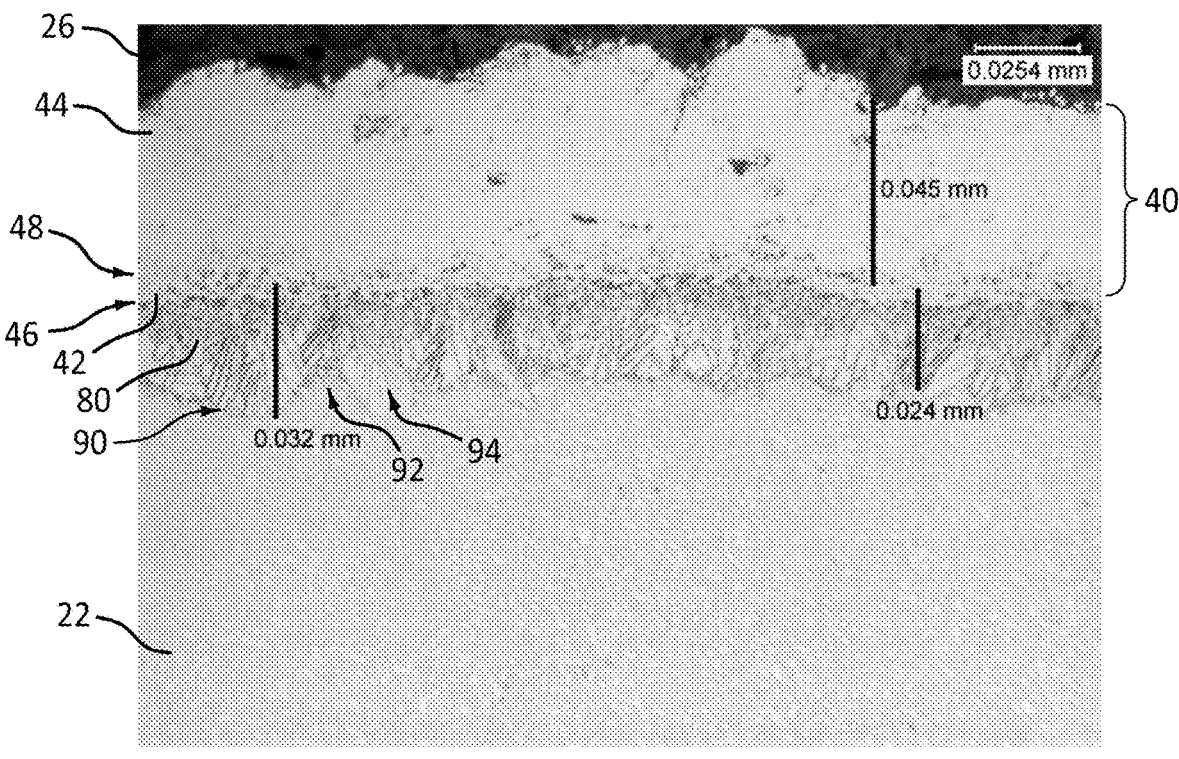
FIG. 9 is a sectional micrograph of a TMS-238 substrate/'603 publication C3 coating combination in an as applied condition.

In FIG. 9 (TMS-238/C3), the boundary 48 is much less distinct than FIG. 1. The diffusion 42 zone is somewhat smaller (also smaller than in the TMS-238/C1 and C5 combinations below). However, a pronounced SRZ 80 is present having a thickness of about 0.001 inch (25 micrometers). The SRZ 80 is characterized by a very well-defined acicular morphology, similar to that of SRZ 32 associated with the aluminide-coated substrate of FIG. 11. The boundary 90 between SRZ and relatively intact substrate alloy is nodular with upward/outward protrusions 92 of intact substrate interspersed with the nodular SRZ protrusions 94. In contrast, FIG. 1 lacks SRZ.

Notably, post exposure (FIG. 2), a surface oxide layer 60 is visible, the oxide appears homogeneous and forming a continuous layer on the coating, which is the type of oxide that is considered beneficial for coating oxidation resistance (e.g., similarly to an anodized protective layer, the continuous layer has both a barrier function and robustness). Below the oxide are two distinct regions: a lower region 62; and an upper region 64. A boundary 66 between them represents the original substrate surface prior to coating deposition (i.e., former 48). The lower region has two distinct phases 70 and 72. 70 is a matrix within which 72 are distinct phases. 70 is a gamma phase matrix in which precipitates 72 form. Layer 60 thickness is approximately 0.00025 in (6.35 micrometers). Layer 62 thickness is approximately 0.0005 in (13 micrometers). Layer 64 thickness is approximately 0.00066 in (17 micrometers). In various implementations, oxide layer thickness is 0.1 mil (2.5 micrometers) or 0.2 mil (5 or 5.1 micrometers) to 0.5 mil (13 or 12.7 micrometer) (or more) measured as a mean or median over the relevant coated area (e.g., at least 1 cm$^2$ or more or less depending on the component). Spallation may, however, occur. See discussion below.

Figure 10:
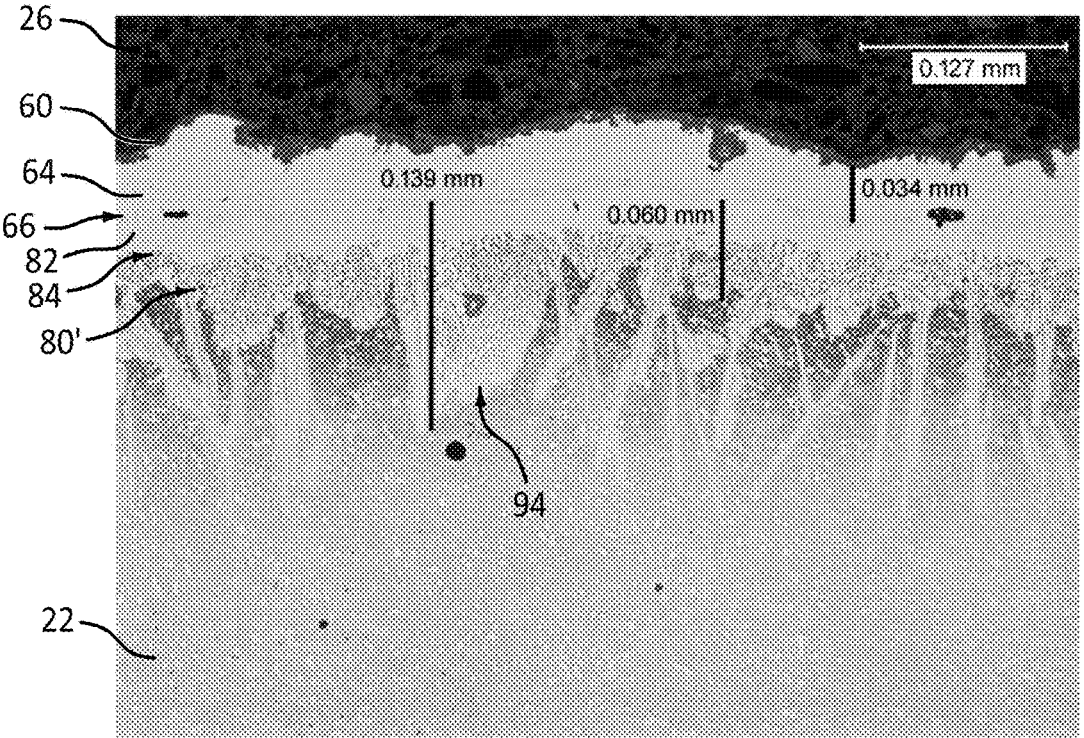
FIG. 10 is a sectional micrograph of the combination of FIG. 9 in a post-exposure condition.

In post-exposure FIG. 10, the SRZ 80' has deepened substantially with the nodular SRZ protrusions 94 extending further downward. In contrast, FIG. 2 the phases 72 are within the diffusion zone and lack the detrimental (to creep and fatigue performance) acicular morphology and are of limited depth. In FIG. 10, the SRZ protrusions extend below the diffusion zone 82 by an SRZ maximum thickness somewhat more than the diffusion zone thickness. The SRZ maximum thickness is also substantially greater than the oxide layer 60 thickness. However, in this particular example, an SRZ nominal or representative thickness (e.g., visually estimated or calculated average such as median or mean) appears close to the thickness of the diffusion layer. It also happens to be close to the thickness of the additive layer, but this is an artifact of the particular additive layer. A much thicker additive layer would still have produced similar diffusion layer and oxide layer thicknesses for the given exposure.

The FIG. 10 SRZ nominal/representative thickness is also much larger than the nominal/representative oxide layer thickness. With the presence of an oxide layer (although not required) evidencing the kind of exposure that would grow an SRZ if the combination was prone to SRZ, an SRZ-resistant combination may be inferred by lack of SRZ relative to oxide formation. Having no post-exposure SRZ layer, if any, of thickness greater than the oxide layer (if any) thus evidences SRZ-resistance of the combination. If there is spallation of an oxide layer the SRZ (if any) thickness may be less than the combination of spalled-off oxide and remaining oxide (if any). However, for oxidation resistance, low, if any, spallation is desirable. Non-spalling oxide may act as a barrier hindering further oxidation.

Notably, FIG. 10 shows two lines that represent maximum and nominal or representative combined SRZ and diffusion layer thickness. If a relative quantity of SRZ, if any, is to be determined, this may involve the SRZ thickness (maximum or representative) relative to the diffusion layer thickness. Thus, low SRZ may be much smaller than the diffusion layer thickness (and typically also much smaller than the additive layer thickness and may also be smaller than the oxide layer thickness, if any). For example, low SRZ may have a nominal/representative thickness not more than 50% or not more than 10% the diffusion layer thickness in a post-exposure condition.

Figure 3:
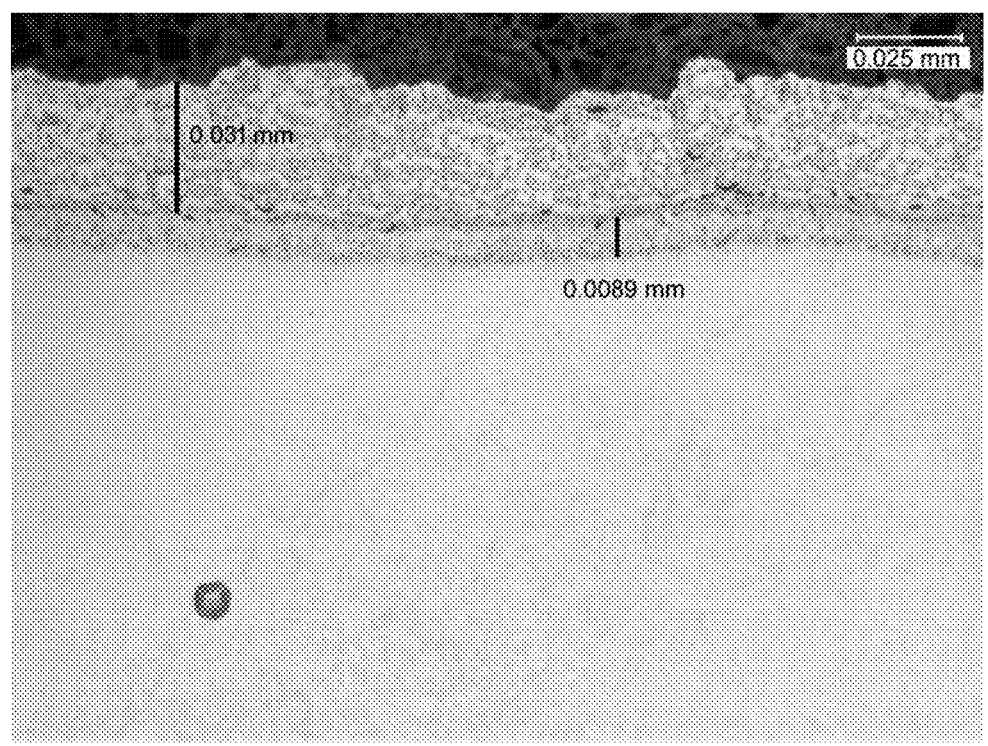
FIG. 3 is a sectional micrograph of a TMS-196 substrate/'603 publication C5 coating combination in an as applied condition.
Figure 4:
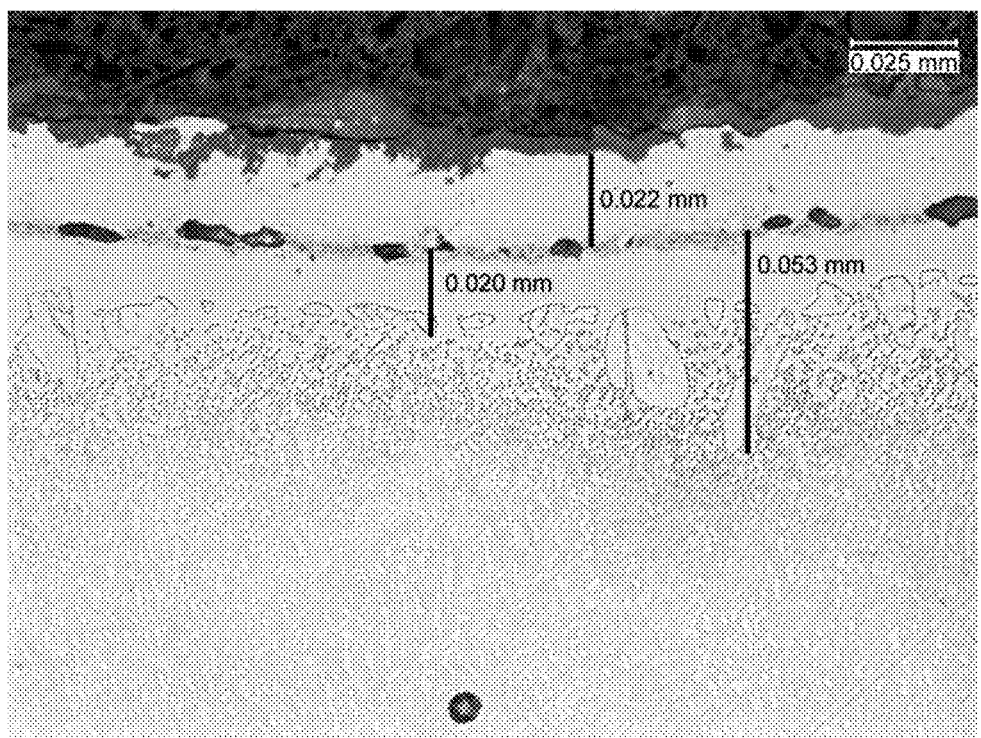
FIG. 4 is a sectional micrograph of the combination of FIG. 3 in a post-exposure condition.

In FIG. 3 (TMS-196/C5), it is seen that the coating diffusion layer's homogeneity and thickness are similar to FIG. 1. The additive layer is thicker in FIG. 3 than in FIG. 1, but that is a consequence of differences in deposition rate for the different coating compositions. In FIG. 4, upper region 64 is thicker than in FIG. 2, but also started from a thicker initial additive layer before exposure. Lower region 62 is similar in thickness and phase fraction between FIG. 2 and FIG. 4. However, the phases 72 are less defined and lower (leaving a relatively larger apparent homogeneous (phase 70) fraction of the lower region 62 (diffusion zone) above. None of the FIG. 9/10 SRZ is present.

Figure 5:
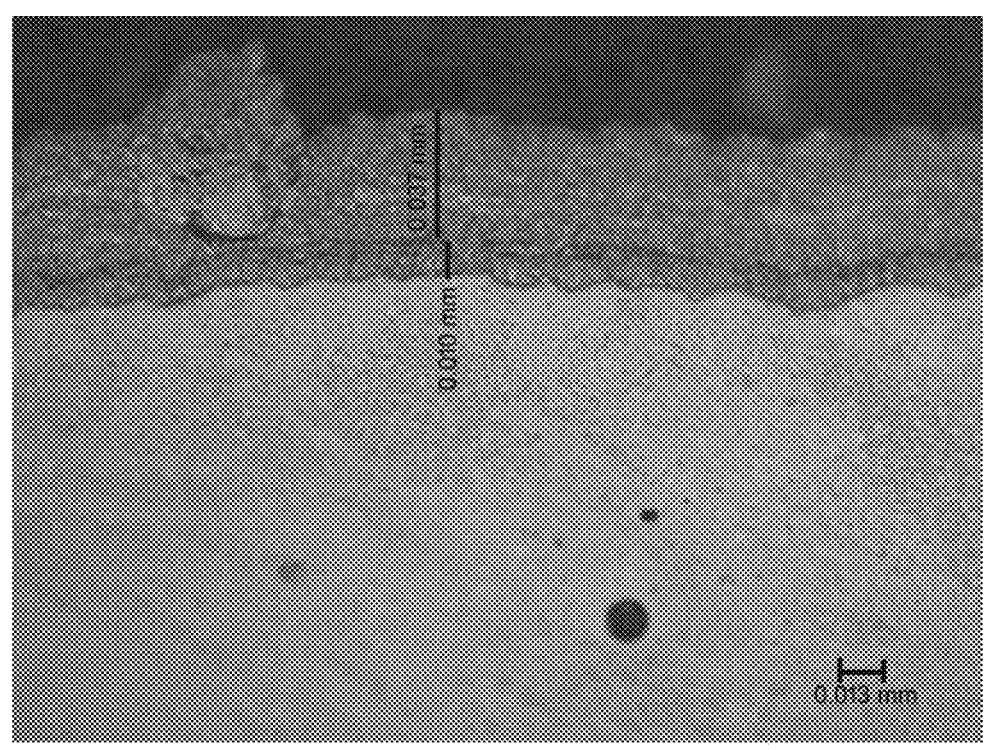
FIG. 5 is a sectional micrograph of a TMS-238 substrate/'603 publication C1 coating combination in an as applied condition.
Figure 6:
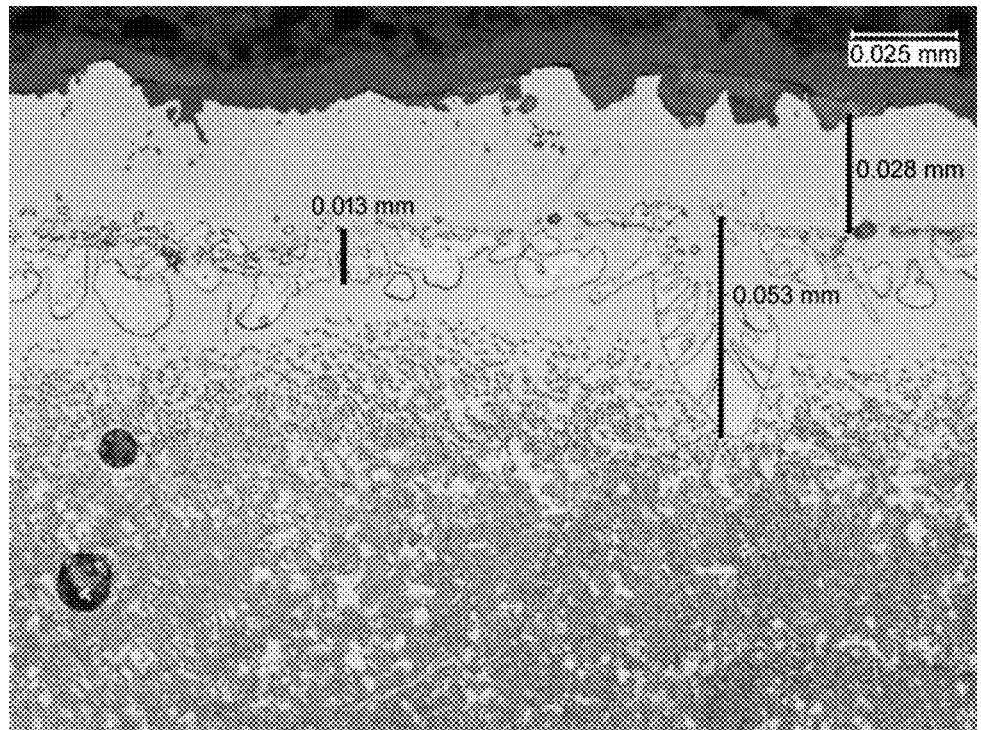
FIG. 6 is a sectional micrograph of the combination of FIG. 5 in a post-exposure condition.

In FIG. 5 (TMS-238/C1), it is seen that the coating diffusion layer's homogeneity and thickness are similar to FIG. 1. The additive layer is thicker in FIG. 5 than in FIG. 1, but it is a consequence of differences in deposition rate for the different coating compositions. In FIG. 6, upper region 64 is thicker than in FIG. 2, but also started from a thicker initial additive layer before exposure. Lower region 62 is similar in thickness and phase fraction between FIG. 2 and FIG. 6.

Figure 7:
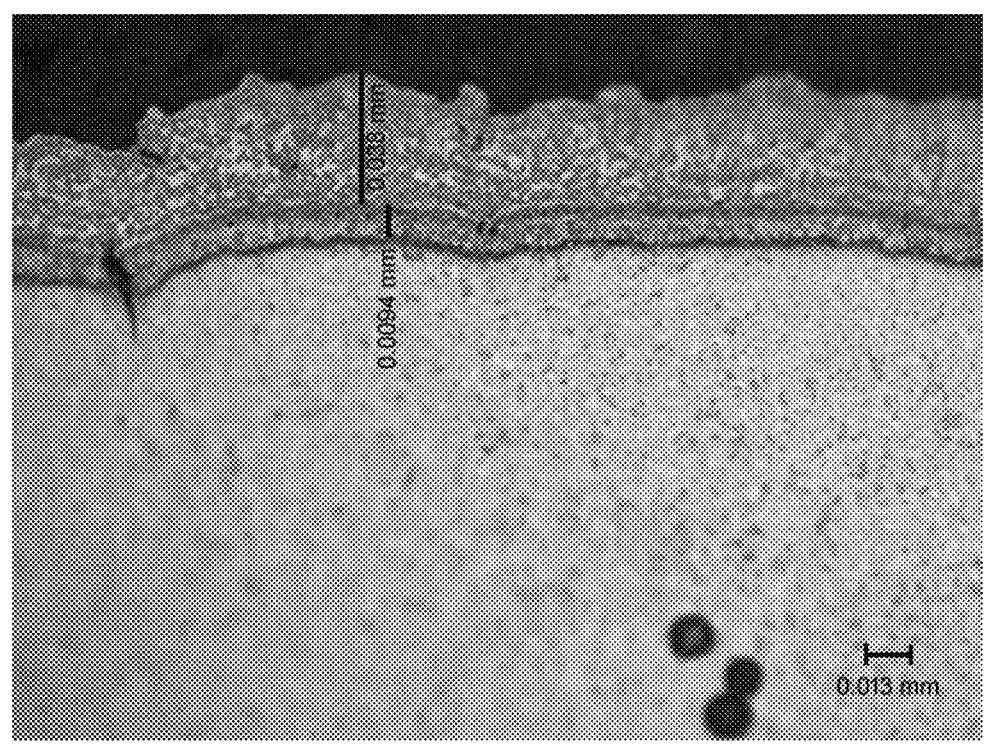
FIG. 7 is a sectional micrograph of a TMS-238 substrate/'603 publication C5 coating combination in an as applied condition.
Figure 8:
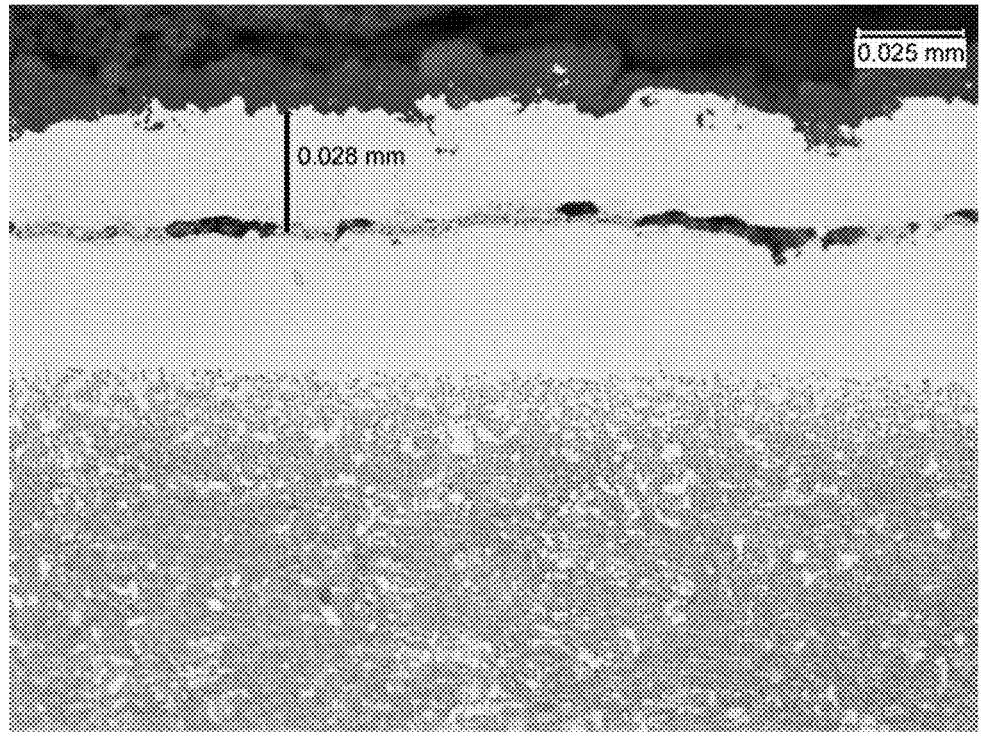
FIG. 8 is a sectional micrograph of the combination of FIG. 7 in a post-exposure condition.

In FIG. 7 (TMS-238/C5), it is seen that the coating diffusion layer's homogeneity and thickness are similar to FIG. 1. The additive layer is thicker in FIG. 7 than in FIG. 1, but it is a consequence of differences in deposition rate for the different coating compositions. In FIG. 8, upper region 64 is thicker than in FIG. 2, but also started from a thicker initial additive layer before exposure. Lower region 62 is a uniform gamma matrix without precipitates and thicker than the two-phase layer observed in FIG. 2. This is believed advantageous based on experience with second generation superalloys where such homogeneous diffusion zones have offered better fatigue and creep performance than material with SRZ.

As noted above, in the '901 patent, Table 6 Example 28, TMS-196 exhibits 25 micrometers SRZ thickness with Coating H. In addition, although the present applicant did not measure the oxidation and hot corrosion resistance of this specific combination, it expects the 3.7% Cr in Coating H will be too low to provide adequate hot corrosion resistance. The '901 patent at col. 6, lines 56-64 suggests that combined 15 wt % (9.2% Ta, 4.8% W and 1% Mo) in coating H will be too high to provide high oxidation protection.

All other coatings (except Coating I) in the '901 patent contain either Re, Ru, or both. Although they were shown in the '901 patent as being helpful in reducing SRZ thickness, they are also detrimental to coating oxidation resistance (as shown by FIG. 6 in the '901 patent and cost, as Re and Ru are substantially less present in the Earth's crust than the other major coating alloying elements (Al, Cr, Co, Ra, W and Mo)).

Although not combined in the '901 patent with TMS-196, Coating I also contains a 15% (Ta+W+Mo) combined amount, thus suggested by the '901 patent as detrimental to oxidation resistance.

Three out of four coatings used on TMS-238 in Matsumoto et al. 2016 contain Ru and Re to reach thermodynamic equilibrium between TMS-238 and the coating. Consistent with the '901 patent, Re and Ru were shown in Matsumoto et al. 2016 to be helpful in reducing SRZ thickness. They are also detrimental to coating oxidation resistance (as shown by Matsumoto et al. 2016 FIG. 6) and cost.

Regarding the fourth Matsumoto et al. 2016 coating TMS-238γ'-Re,Ru, with 2.2% Cr, I expect this to be too low in hot corrosion resistance, even less than for coating H in the '901 patent.

A similar argument can be made with US2013202913/EP2631324A1, in which coating BC-1 (identical to the '901 patent Coating H) is applied to Re- and Ru-containing TMS-138A alloy. Based on the '901 patent, the combined 15 wt % (9.2% Ta, 4.8% W and 1% Mo) it contains would be too high to provide high oxidation protection. A similar argument can be made with '913 publication coatings BC-2 to BC-7, as they all contain a minimum of combined 13 wt % (Ta+W+Mo).

In testing, a particular benefit was seen in the pairing of a TMS-196 or TMS-238 substrate and a CPW-C1 or CPW-05 coating of the '603 publication. Specifically, less than 1 micrometer SRZ was observed for CPW-C1 (present FIGS. 1 and 2) and CPW-05 (present FIGS. 3 and 4) on TMS-196, which is lower than the '901 patent reports for Coating H on TMS-196. In addition, CPW-C1 on TMS-196 was shown in testing by the present applicant to have superior oxidation resistance over CPW-C1 on PWA1484. Consistent with the teachings of the '901 patent, CPW-C1 on TMS-196 was expected to perform better in oxidation than Coating H, as CPW-C1 contains only 10.4 wt % (Ta+W+Mo) vs. 15 wt % (Ta+W+Mo) for Coating H.

However, on TMS-238, CPW-C1 resulted in less than 1 micrometer of SRZ thickness and superior cyclic oxidation resistance to PWA1484 with CPW-C1. Similarly on TMS-238, CPW-05 resulted in less than 1 micrometer of SRZ thickness and equivalent oxidation resistance to PWA1484 with CPW-05.

In the same set of SRZ resistance trials, all TMS-196/CPW-C1, TMS-196/CPW-05, TMS-238/CPW-C1 and TMS-238/CPW-05 samples had better SRZ resistance than PWA1484 with a reference Pt-enriched aluminide diffusion coating.

In the same set of oxidation trials, all TMS-196/CPW-C1, TMS-238/CPW-C1 and TMS-238/CPW-05 samples had equal or better cyclic oxidation resistance than PWA1484 with the reference Pt-enriched aluminide diffusion coating.

Table I below contains data of oxidation resistance for various base alloy(substrate)/coating combinations (compositions in Tables IV and V). These include a number of the "CPW-V" substrate alloys and "CPW-C" coatings of the '603 publication. Oxidation was measured via furnace cycling tests using coated metal pucks using a reference substrate (PWA 1484) and coating (CPW-C6) to define 1.00 as a normalizing time to coating defeat. Thus, a larger number indicates greater time and more oxidation resistance. Specifically, oxidation exposures were carried out in a cyclic box furnace. The specimens were subjected to multiple one hour cycles of heating to 2150° F. (about 1177° C.) (about 45 minutes at that temperature after ramp-up) with visual inspection between cycles. Coating lives were determined on an hours/mil basis based on a visual determination of coating failure over 50% of the outside diameter (OD) of the cylindrical specimen (e.g., a 2 mil thick coating that failed over half the surface in 2000 hours yields 1000 hours per mil).

TABLE I

Oxidation Resistance of Alloy/Coating Combinations

| | Coating | | | | | | |
|---|---|---|---|---|---|---|---|
| Base alloy | CPW-C1 | CPW-C2 | CPW-C3 | CPW-C4 | CPW-C5 | CPW-C6 | Ex. Pt-Al |
| PWA1484 | 0.99 | 1.40 | 0.65 | 0.47 | 0.69 | 1.00 | 0.66 |
| CPW V9 | 0.75 | NM | 0.70 | 0.28 | 0.31 | 0.68 | 0.53 |
| CPW V8 | 1.13 | 1.54 | 0.39 | 0.31 | 0.62 | 1.00 | 0.52 |
| CPW V6 | 0.71 | 0.94 | 0.56 | 0.22 | 0.26 | 0.78 | 0.47 |
| CPW V4 | 0.35 | 0.30 | 0.54 | 0.15 | 0.24 | 0.44 | 0.45 |
| CPW V2 | 0.25 | 0.73 | 0.70 | 0.23 | 0.69 | 0.65 | NM |
| CPW V3 | 0.26 | 0.46 | 0.65 | 0.36 | 0.62 | 0.52 | NM |
| CPW V11 | 0.89 | 1.02 | 0.67 | 0.38 | 0.22 | 0.65 | 0.66 |
| CMSX-4 | 1.66 | 0.77 | 0.95 | 0.44 | 0.47 | 1.56 | 1.19 |
| CPW V10 | 0.67 | 1.20 | 0.51 | 0.20 | 0.23 | 0.75 | 1.70 |
| TMS 238 | 1.18 | 0.83 | 0.98 | 0.60 | 0.73 | 1.23 | 1.02 |
| CPW V5 | 0.14 | 0.68 | 0.38 | 0.19 | 0.33 | 0.87 | 0.36 |
| TMS 196 | 1.13 | 0.83 | 0.62 | 0.17 | 0.38 | 0.54 | 0.56 |
| CPW V7 | 0.65 | 0.82 | 0.38 | 0.17 | 0.25 | 0.55 | 0.66 |

NM = not measured

The final column (Ex. Pt-A1) is a commercial non-overlay platinum aluminide diffusion coating.

Tables II and III respectively identify nominal (visually estimated average) and maximum SRZ thickness:

TABLE II

SRZ Resistance of Alloy/Coating Combinations
(SRZ nominal (nominal) thickness (mil) after 400 h at 2000° F.)

| | Coating | | | | | | |
|---|---|---|---|---|---|---|---|
| Base Alloy | CPW-C1 | CPW-C2 | CPW-C3 | CPW-C4 | CPW-C5 | CPW-C6 | Ex. Pt-Al |
| PWA1484 | 0 | 0.6 | 0 | 0 | 0 | 0 | 2 |
| CPW V9 | 0 | 1.3 | 1.1 | 0 | 0 | 1.6 | 7 |
| CPW V8 | 0 | 1.6 | 1 | 0 | 0 | 1.6 | NM |
| CPW V6 | 0 | 0 | 1.5 | 0 | 0 | 1.6 | 2.1 |
| CPW V4 | 0 | 0 | 2.3 | 0 | 0 | 1.9 | 8.4 |
| CPW V2 | 0.6 | 0.9 | 0 | 0 | NM | NM | 5.7 |
| CPW V3 | 0 | 0.4 | 0 | 0 | NM | NM | 4.1 |
| CPW V11 | 0 | 0 | 1.4 | 0 | 0 | 1.5 | NM |
| CMSX-4 | 0 | 0 | 0 | 0 | 0 | 0 | 1.9 |
| CPW V10 | 0 | 0 | 1 | 0 | 0 | 1.7 | 7.5 |
| TMS 238 | 0 | 0.8 | 1.5 | 0 | 0 | 1.3 | 4.7 |
| CPW V5 | 0 | 0 | 1.4 | 0 | 0 | 1.2 | 8.3 |
| TMS 196 | 0 | 0 | 1.6 | 0 | 0 | 0.9 | 6.1 |
| CPW V7 | 0 | 0 | 0 | 0 | 0 | 0 | 1.8 |

NM = not measured

TABLE III

SRZ Resistance of Alloy/Coating Combinations
(SRZ maximum thickness (mil) after 400 h at 2000° F.)

| | Coating | | | | | | |
|---|---|---|---|---|---|---|---|
| Base Alloy | CPW-C1 | CPW-C2 | CPW-C3 | CPW-C4 | CPW-C5 | CPW-C6 | Ex. Pt-Al |
| PWA1484 | 0 | 0 | 5.5 | 0 | 0.9 | 0 | 6.1 |
| CPW V9 | 0 | 2.7 | 4.6 | 1.4 | 0 | 3.3 | 7 |
| CPW V8 | 2.6 | 2.4 | 10.5 | 2.9 | 0 | 2.7 | NM |
| CPW V6 | 1 | 0 | 4.3 | 0 | 0 | 2.2 | 3.1 |
| CPW V4 | 0 | 1.5 | 4.1 | 1.9 | 0 | 2.6 | 13.9 |
| CPW V2 | 1.8 | 1.8 | 7 | 0 | NM | NM | 10.5 |
| CPW V3 | 0 | 1.6 | 5.1 | 0 | NM | NM | 10 |
| CPW V11 | 0 | 0 | 3.2 | 0 | 0 | 2.7 | NM |
| CMSX-4 | 0 | 0 | 0 | 0 | 0.7 | 0 | 5 |
| CPW V10 | 1.4 | 2.3 | 3.1 | 1.4 | 0 | 4.9 | 7.5 |

TABLE III-continued

SRZ Resistance of Alloy/Coating Combinations
(SRZ maximum thickness (mil) after 400 h at 2000° F.)

| | Coating | | | | | | |
|---|---|---|---|---|---|---|---|
| Base Alloy | CPW-C1 | CPW-C2 | CPW-C3 | CPW-C4 | CPW-C5 | CPW-C6 | Ex. Pt-Al |
| TMS 238 | 0 | 2 | 6.4 | 0 | 0 | 2.8 | 7.5 |
| CPW V5 | 0 | 0 | 5.8 | 1.7 | 0 | 2.4 | 8.3 |
| TMS 196 | 0 | 0 | 7.3 | 0 | 0 | 7.1 | 14.5 |
| CPW V7 | 0 | 2.9 | 0.9 | 0.9 | 0 | 3.5 | 1.8 |

NM = not measured

Tables IV and V, respectively provide coating and substrate nominal chemistries (balance Ni plus impurities).

TABLE IV

Coating Nominal Measured Chemistries (wt. %, bal. Ni)

| | Element | | | | | | | | | |
|---|---|---|---|---|---|---|---|---|---|---|
| Coating | Al | Cr | Co | Hf | Si | Y | Mo | Ta | W | Zr |
| CPW-C1 | 7.0 | 4.7 | 13.0 | 0.46 | 0.26 | 0.54 | 0.0 | 5.6 | 4.8 | 0.00 |
| CPW-C2 | 9.2 | 4.5 | 13.2 | 0.49 | 0.27 | 0.52 | 0.0 | 4.1 | 2.7 | 0.0 |
| CPW-C3 | 6.0 | 23.8 | 3.3 | 0.46 | 0.29 | 0.19 | 0.0 | 3.1 | 6.0 | 0.0 |
| CPW-C4 | 5.9 | 13.2 | 13.2 | 0.43 | 0.29 | 0.00 | 0.0 | 3.5 | 3.0 | 0.0 |
| CPW-C6 | 10.0 | 11.5 | 6.25 | 0.40 | 0.20 | 0.50 | 1.40 | 4.5 | 4.0 | 0.15 |
| CPW-C5 | 8.5 | 12.5 | 12.5 | 0.30 | 0.20 | 0.40 | 0.0 | 0.0 | 0.0 | 0.15 |

TABLE V

Substrate Nominal Specification Chemistries (wt. %, bal. Ni)

| | Element | | | | | | | | | |
|---|---|---|---|---|---|---|---|---|---|---|
| Substrate | Al | Cr | Co | Hf | Si | Mo | Re | Ta | W | Ru |
| PWA1484 | 5.7 | 5.0 | 10.0 | 0.0 | 0.0 | 1.9 | 3.0 | 8.7 | 5.9 | 0.0 |
| CPW-V9 | 6.0 | 3.7 | 2.0 | 0.0 | 0.0 | 1.0 | 5.0 | 4.2 | 7.0 | 4.0 |
| CPW V8 | 6.0 | 2.8 | 2.0 | 0.0 | 0.0 | 2.1 | 4.5 | 5.0 | 7.0 | 5.5 |
| CPW V6 | 6.1 | 3.0 | 4.8 | 0.0 | 0.0 | 2.2 | 3.5 | 3.5 | 8.5 | 5.0 |
| CPW V4 | 6.2 | 2.1 | 7.0 | 0.0 | 0.0 | 2.7 | 4.5 | 2.3 | 9.0 | 7.0 |
| CPW V2 | 5.7 | 5.0 | 6.2 | 0.0 | 0.0 | 1.6 | 5.4 | 5.5 | 5.4 | 2.2 |
| CPW-V3 | 5.8 | 4.7 | 12.2 | 0.0 | 0.0 | 1.5 | 5.5 | 6.7 | 5.4 | 2.1 |
| CPW-V11 | 5.8 | 5.0 | 12.5 | 0.0 | 0.0 | 1.5 | 5.5 | 7.0 | 5.0 | 3.0 |
| CMSX-4 | 5.7 | 6.3 | 9.5 | 0.0 | 0.0 | 0.6 | 2.9 | 6.4 | 6.4 | 0.0 |
| CPW V10 | 6.2 | 2.1 | 2.0 | 0.0 | 0.0 | 2.7 | 4.5 | 4.0 | 4.0 | 7.0 |
| TMS 238 | 5.9 | 4.6 | 6.5 | 0.0 | 0.0 | 1.1 | 6.4 | 7.6 | 4.0 | 5.0 |
| CPW V5 | 6.2 | 2.3 | 5.6 | 0.0 | 0.0 | 3.2 | 3.0 | 3.3 | 9.8 | 7.0 |
| TMS 196 | 5.6 | 4.6 | 5.8 | 0.0 | 0.0 | 2.4 | 6.4 | 5.6 | 5.0 | 5.0 |
| CPW V7 | 5.7 | 2.6 | 8.4 | 0.0 | 0.0 | 2.3 | 4.2 | 3.0 | 8.5 | 5.0 |

Table VI below provides composition for: nominal for TMS-196 and TMS-238; a narrower range for each; an intermediate range for each; and a broader range for each; and three ranges encompassing both (all values in wt. %):

TABLE VI

Substrate Composition

| Designation | Ni | Re | Ru | Cr | Co | Mc | W | Ta | Al | Hf |
|---|---|---|---|---|---|---|---|---|---|---|
| TMS-196 nom. | bal. | 6.4 | 5.0 | 4.6 | 5.6 | 2.4 | 5.0 | 5.6 | 5.6 | 0.10 |
| 196 narrow range | bal. | 6.2-6.6 | 4.7-5.2 | 4.1-5.1 | 5.3-5.9 | 2.2-2.7 | 4.8-5.2 | 5.4-5.8 | 5.5-5.8 | 0.050-0.15 |
| 196 int. range | bal. | 5.8-7.0 | 4.5-5.5 | 3.8-5.4 | 5.0-6.2 | 2.0-3.0 | 4.4-5.6 | 5.0-6.2 | 5.3-5.9 | 0.050-0.30 |
| 196 broader range | bal. | 5.4-7.4 | 4.1-5.9 | 3.0-6.2 | 3.0-8.2 | 1.0-3.8 | 4.0-6.0 | 4.6-6.6 | 5.0-6.2 | 0.050-0.30 |
| TMS-238 nom. | bal. | 6.4 | 5.0 | 4.6 | 6.5 | 1.1 | 4.0 | 7.6 | 5.9 | 0.10 |
| 238 narrow range | bal. | 6.2-6.6 | 4.7-5.2 | 4.1-5.1 | 6.2-6.8 | 0.9-1.3 | 3.8-4.2 | 7.3-7.9 | 5.7-6.1 | 0.050-0.15 |
| 238 int. range | bal. | 5.8-7.0 | 4.5-5.5 | 3.8-5.4 | 5.9-7.1 | 0.7-1.5 | 3.5-4.5 | 6.9-8.3 | 5.5-6.3 | 0.050-0.30 |
| 238 broader range | bal. | 5.4-7.4 | 4.1-5.9 | 3.0-6.2 | 3.0-10.0 | 0.5-1.7 | 3.0-5.0 | 6.6-8.6 | 5.4-6.4 | 0.050-0.30 |
| Both narrow | bal. | 6.2-6.6 | 4.7-5.2 | 4.1-5.1 | 5.3-6.8 | 0.9-2.7 | 3.8-5.2 | 5.4-7.9 | 5.5-6.1 | 0.050-0.15 |
| Both intermediate | bal. | 5.8-7.0 | 4.5-5.5 | 3.8-5.4 | 5.0-7.1 | 0.7-3.0 | 3.5-5.6 | 5.0-8.3 | 5.3-6.3 | 0.050-0.30 |
| Both broader | bal. | 5.4-7.4 | 4.1-5.9 | 3.0-6.2 | 3.0-10.0 | 0.5-3.8 | 3.0-6.0 | 4.6-8.6 | 5.0-6.4 | 0.050-0.30 |

If no impurities, nominal Ni in TMS-196 is 59.7 wt. % and in TMS-238 58.8 wt. %. The range asymmetries, (e.g., departures from being centered on the nominal) partially reflect particular variations discussed in the '714 and '271 publications.

Other elements than those in the listed columns may be present at up to impurity levels to avoid high variations in alloy melting temperature (e.g., Fe, Cu, Pb, Bi, Se, Te, and Th notably reduce melting temperature), to keep high oxidation resistance (e.g., P and S notably reduce oxidation resistance), or may be present as minor intentional alloyants to increase alloy strength (e.g. B, C) or to increase alloy oxidation resistance (e.g. Si, Zr, Y). For example, these other elements may be generally at individual contents up to 5 ppm for impurities affecting melting temperature, up to 100 ppm for impurities affecting oxidation resistance, up to 0.05% for minor alloying elements increasing strength and up to 0.05% for minor alloying elements increasing oxidation resistance.

Thus, example combined contents of elements other than those in the columns is up to an example 2.0 wt. %, more narrowly up to 1.0 wt. % or more broadly up to 4.0 wt. %. And individual contents may be up to 0.50 wt. %, more narrowly up to 0.25 wt. % or more broadly up to 1.0 wt. %. Or may be such lower amounts as described in the foregoing paragraph. Alternatively or additionally, these catch all individual other element content limits may be paired with these catch all combined other element content limits in any combination.

Table VII below provides wt. % (bal. Ni) composition for: nominal CPW-C1 and CPW-05; a narrower range for each; and a broader range for each, and two ranges encompassing both:

In some embodiments other elements may be present at impurity levels or other levels discussed below. If no impurities, nominal Ni in CPW-C1 is 63.6 wt. % and in CPW-C5 65.5 wt. %.

These numbers reflect measured coating composition after a diffusion heat treat and away from a boundary with the substrate.

Particularly on uncooled components (e.g., uncooled blades) the C1 or C5 coating layer may be the only applied coating layer. Particularly on internally-cooled components (e.g., cooled blades), the coating may serve as a bondcoat, with a ceramic thermal barrier coating (TBC) that may be applied after. In a hybrid situation, the TBC may be on a gaspath surface (e.g., the airfoil and platform OD surface of a blade) while not another surface (e.g., the platform underside or ID surface of a blade and optionally portion of a root). And some portion of the article may lack the coating layer or any coating (e.g., a portion of a blade firtree or dovetail attachment root). Example ceramic thermal barrier coatings include zirconias (e.g. yttria-stabilized zirconia (YSZ) or gadolinia-stabilized zirconia (GSZ, GdZ, or GZO)). One example blade configuration/shape is shown in U.S. Pat. No. 8,267,663B2 (the '663 patent), Larose et al., Sep. 18, 2012, entitled "Multi-Cast Turbine Airfoils and Methods for Making Same", the disclosure of which is incorporated by reference herein in its entirety as if set forth at length. The '663 patent discloses multi-cast alloys but the present teachings are also applicable to similarly configured single-zone blades among other variations.

Numbers for feedstock (e.g., for cathodic arc deposition or other PVD) will differ due to differential elemental attrition during deposition. Boundary interdiffusion will

TABLE VII

Coating Composition

| Designation | Al | Cr | Co | Hf | Si | Y | Zr | Ta | W |
|---|---|---|---|---|---|---|---|---|---|
| CPW-C1 Nominal | 7.0 | 4.7 | 13.0 | 0.46 | 0.26 | 0.54 | 0 | 5.6 | 4.8 |
| CPW-C1 Narrow Range | 6.3-7.7 | 4.1-5.3 | 11.8-14.2 | 0.1-0.5 | 0.2-0.8 | 0.2-0.8 | 0-0.8 | 5.0-6.2 | 4.3-5.3 |
| CPW-C1 Broader Range | 6.0-8.0 | 4.0-6.0 | 11.0-15.0 | 0.1-1.0 | 0.1-1.0 | 0.1-1.0 | 0-1.0 | 5.0-7.0 | 4.0-6.0 |
| CPW-C5 Nominal | 8.5 | 12.5 | 12.5 | 0.3 | 0.2 | 0.4 | 0.15 | 0 | 0 |
| CPW-C5 Narrow Range | 7.6-9.4 | 10.9-14.1 | 11.4-13.6 | 0.1-0.5 | 0.1-0.8 | 0.2-0.8 | 0.1-0.5 | 0-0 | 0-0 |
| CPW-C5 Broader Range | 7.0-10.0 | 10.0-15.0 | 11.0-14.0 | 0.1-1.0 | 0.1-1.0 | 0.1-1.0 | 0.1-1.0 | 0-0 | 0-0 |
| Both narrow | 6.3-9.4 | 4.1-14.1 | 11.4-14.2 | 0.1-0.5 | 0.1-0.8 | 0.2-0.8 | 0-0.8 | 0-6.2 | 0-5.3 |
| Both broader | 6.0-10.0 | 4.0-15.0 | 11.0-15.0 | 0.1-1.0 | 0.1-1.0 | 0.1-1.0 | 0-1.0 | 0-7.0 | 0-6.0 | occur and, over time, heat treat interdiffusion will affect the entire bondcoat layer depth. Further in-service interdiffusion and reaction will occur.

The Table VI (and other) coating composition was determined on the additive layer of the coating itself with microprobe analysis, as-coated, after diffusion heat treat, but before oxidative environmental exposure. It is noted that coating composition will differ from feedstock (e.g., ingot) composition due to differential proportions of different elements in the ingot depositing on the substrate. These relative deposition efficiencies depend on factors including the particular materials, deposition apparatus, operating parameters and the like. Based upon known effects of such factors, an ingot composition can be determined for a desired coating composition, subject to some error and possible trial and error adjustment. For a typical blade, coating composition will reflect the pre-exposure values until the blade is used (unless a pre-use exposure is applied to the blade). For the foregoing reasons, as-applied coating measurements are used rather than ingot or post-exposure values/measurements.

Cathodic arc deposition offers beneficial thickness control/uniformity on complex shapes.

Other elements than those in the listed columns may be present as minor alloyants for increased oxidation resistance (e.g. Ce, La).

Impurities may often be easier control. Thus, example combined contents of elements other than Ni and those in the columns is up to an example 2.0 wt. %, more narrowly up to 1.0 wt. % or more broadly up to 4.0 wt. %. And individual contents may be up to 0.50 wt. %, more narrowly up to 0.25 wt. % or more broadly up to 1.0 wt. %. but may typically be much less. For C5 ranges in Table VII, further alternative compositional ranges may be formed by modifying the two listed ranges to include Ta or W at above nominally zero levels or impurity levels. For example, these may be obtained by including Ta and W within the catch all up to 0.50 wt. %, more narrowly up to 0.25 wt. % or more broadly up to 1.0 wt. % (discussed for non-listed elements). Alternatively or additionally, the catch all coating individual other element content limits may be paired with the catch all combined other content limits in any combination.

Some element range asymmetries indicate that a minimum content is required for maintaining high oxidation resistance (e.g., the smaller the content, the greater the effects of incidental variations). A minimum individual amount of Hf and Y are required to be effective and consistently added at a given level). Si might go lower, thus alternative ranges to those above may have lower Si bounds of 0.0.

In terms of combinations: In some examples, 10.0≤(Cr+W+Mo)≤16.0 is believed beneficial for oxidation resistance.

In some examples, 0.0≤(Ta+W+Mo)≤13.0 is believed beneficial for oxidation resistance.

In some examples, 10.0≤W+Ta≤12.0 or Ta+W≤0.05 is believed beneficial for oxidation resistance.

In some examples, Mo up to 2.0 wt. % is not expected to be detrimental to oxidation resistance.

In some examples, Re may be present up to 0.05 wt. %. On the one hand some publications suggest it reduces SRZ formation. However, it is undesirably expensive and reduces oxidation resistance.

In some examples, Ru may be present up to 0.05 wt. %. On the one hand some publications suggest it reduces SRZ formation. However, it is undesirably expensive and reduces oxidation resistance.

Component materials and manufacture techniques and assembly techniques may be otherwise conventional.

As noted above observed SRZ (if any) was less than or not more than 1.0 micrometer. More preferably, there may be not more than 0.05 micrometer or no detectable SRZ.

The use of "first", "second", and the like in the following claims is for differentiation within the claim only and does not necessarily indicate relative or absolute importance or temporal order. Similarly, the identification in a claim of one element as "first" (or the like) does not preclude such "first" element from identifying an element that is referred to as "second" (or the like) in another claim or in the description.

Where a measure is given in English units followed by a parenthetical containing SI or other units, the parenthetical's units are a conversion and should not imply a degree of precision not found in the English units.

One or more embodiments have been described. Nevertheless, it will be understood that various modifications may be made. For example, when applied to an existing baseline configuration, details of such baseline may influence details of particular implementations. Accordingly, other embodiments are within the scope of the following claims.

What is claimed is:

1. An article comprising:
a nickel-based alloy substrate consisting of, in weight percent:
6.2-6.6 Re;
4.7-5.2 Ru;
4.1-5.1 Cr;
5.3-6.8 Co;
0.9-2.7 Mo;
3.8-5.2 W;
5.4-7.9 Ta;
5.5-6.1 Al;
0.050-0.15 Hf;
no more than 0.50 all other elements, if any, individually; and
no more than 2.0 all other elements, if any, combined; and
a nickel-based coating or layer thereof on the substrate consisting of, in weight percent:
6.0-8.0 Al;
4.0-6.0 Cr;
9.0-15.0 Co;
0.1-1.0 Hf;
0.1-1.0 Si;
0.1-1.0 Y;
up to 1.0 Zr if any;
5.0-7.0 Ta;
4.0-6.0 W;
no more than 0.50 all other elements, if any, individually; and
no more than 2.0 all other elements, if any, combined.

2. The article of claim 1 wherein:
a secondary reaction zone, if any of the substrate is no more than 5.0 micrometers thick.

3. The article of claim 1 wherein:
the substrate lacks a secondary reaction zone.

4. The article of claim 1 wherein:
the coating comprises an additive layer and a diffusion layer; and
the coating composition is measured in the additive layer.

5. The article of claim 1 wherein:
the substrate is a single crystal substrate.

6. The article of claim 5 wherein:
a secondary reaction zone, if any of the substrate is no more than 5.0 micrometers thick.

7. The article of claim 6 wherein:

the coating comprises an additive layer and a diffusion layer; and the coating composition is measured in the additive layer.

8. The article of claim 1 wherein:

the coating consists of, in weight percent:

6.3-7.7 Al;

4.1-5.3 Cr;

99.8-14.2 Co;

0.1-0.5 Hf;

0.2-0.8 Si;

0.2-0.8 Y;

up to 0.8 Zr if any;

5.0-6.2 Ta;

4.3-5.3 W;

no more than 0.50 all other elements, if any, individually; and no more than 2.0 all other elements, if any, combined.

9. The article of claim 8 wherein:

a secondary reaction zone, if any of the substrate is no more than 5.0 micrometers thick.

10. The article of claim 8 wherein:

the substrate lacks a secondary reaction zone.

11. The article of claim 8 wherein:

the coating comprises an additive layer and a diffusion layer; and the coating composition is measured in the additive layer.

12. The article of claim 1 wherein:

the substrate is a single crystal substrate.

13. The article of claim 1 wherein:

the nickel-based alloy substrate consists of, in weight percent:

6.2-6.6 Re;

4.7-5.2 Ru;

4.1-5.1 Cr;

5.3-5.9 Co;

2.2-2.7 Mo;

4.8-5.2 W;

5.4-5.8 Ta;

5.5-5.8 Al;

0.050-0.15 Hf;

no more than 0.50 all other elements, if any, individually; and no more than 2.0 all other elements, if any, combined.

14. The article of claim 13 wherein:

the substrate is a single crystal substrate.

15. The article of claim 1 wherein:

the nickel-based alloy substrate consists of, in weight percent:

6.2-6.6 Re;

4.7-5.2 Ru;

4.1-5.1 Cr;

6.2-6.8 Co;

0.9-1.3 Mo;

3.8-4.2 W;

7.3-7.9 Ta;

5.7-6.1 Al;

0.050-0.15 Hf;

no more than 0.50 all other elements, if any, individually; and no more than 2.0 all other elements, if any, combined.

16. The article of claim 15 wherein:

the coating consists of, in weight percent:

6.3-7.7 Al;

4.1-5.3 Cr;

11.8-14.2 Co;

0.1-0.5 Hf;

0.2-0.8 Si;

0.2-0.8 Y;

up to 0.8 Zr if any;

5.0-6.2 Ta;

4.3-5.3 W;

no more than 0.50 all other elements, if any, individually; and no more than 2.0 all other elements, if any, combined.

17. The article of claim 16 wherein:

a secondary reaction zone, if any of the substrate is no more than 5.0 micrometers thick.

18. The article of claim 16 wherein:

the substrate lacks a secondary reaction zone.

19. The article of claim 16 wherein:

the coating comprises an additive layer and a diffusion layer; and the coating composition is measured in the additive layer.

20. The article of claim 1 wherein:

the composition of the substrate is measured away from a diffusion zone with the coating; and the composition of the coating is measured away from a diffusion zone with the substrate.

21. The article of claim 1 wherein in the coating in weight percent one or more of:

$10.0 \leq (Cr+W+Mo)$;

$(Ta+W+Mo) \leq 13.0$;

$10.0 \leq W+Ta \leq 12.0$;

$Re \leq 0.05$; and $Ru \leq 0.05$.

\* \* \* \* \*